(12) United States Patent
Bräutigam et al.

(10) Patent No.: US 11,580,021 B2
(45) Date of Patent: Feb. 14, 2023

(54) METHOD AND DEVICE FOR SITUATION-DEPENDENT STORAGE OF DATA OF A SYSTEM

(71) Applicant: Audi AG, Ingolstadt (DE)

(72) Inventors: Heribert Bräutigam, Ingolstadt (DE); Heiko Diederichs, Kösching (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 16/615,038

(22) PCT Filed: May 29, 2018

(86) PCT No.: PCT/EP2018/063973
§ 371 (c)(1),
(2) Date: Nov. 19, 2019

(87) PCT Pub. No.: WO2018/219886
PCT Pub. Date: Dec. 6, 2018

(65) Prior Publication Data
US 2020/0210336 A1 Jul. 2, 2020

(30) Foreign Application Priority Data
Jun. 2, 2017 (DE) .................... 10 2017 209 409.5

(51) Int. Cl.
*G06F 12/0804* (2016.01)
*G07C 5/08* (2006.01)
*G06F 12/02* (2006.01)

(52) U.S. Cl.
CPC ...... *G06F 12/0804* (2013.01); *G06F 12/0246* (2013.01); *G07C 5/0841* (2013.01); *G06F 2212/1032* (2013.01)

(58) Field of Classification Search
CPC ............ G06F 12/0246; G06F 12/0804; G06F 2212/1032; G07C 5/0841
See application file for complete search history.

(56) References Cited

U.S. PATENT DOCUMENTS 8,160,771 B2   4/2012 Okada et al.
8,219,280 B2   7/2012 Ishikawa
(Continued)

FOREIGN PATENT DOCUMENTS

CN   ON 101238375 A   8/2008
CN   101896943 A   11/2010
(Continued)

OTHER PUBLICATIONS

International Search Report and Written Opinion of the International Searching Authority directed to related International Patent Application No. PCT/EP2018/063973, dated Sep.5, 2018, with certified English-language translation of written opinion; 18 pages.
(Continued)

*Primary Examiner* — Eric T Oberly
(74) *Attorney, Agent, or Firm* — Sterne, Kessler, Goldstein & Fox P.L.L.C.

(57) ABSTRACT

This disclosure relates to a method for situation-dependent storage of data of a system, in which data of the system is detected, is amalgamated in at least one data block and is stored in a volatile memory, and in which, in response to the occurrence of at least one predefined trigger event in the at least one data block, amalgamated data are transferred from the volatile memory into a read-only memory, and in which a time window, in which the data for the at least one data block is captured, is selected automatically and dynamically according to the at least one trigger event.

9 Claims, 1 Drawing Sheet

(56) References Cited

U.S. PATENT DOCUMENTS

| | | | |
|---|---|---|---|
| 9,373,199 B2 | 6/2016 | Dippl et al. | |
| 10,343,697 B2 | 7/2019 | Rieth | |
| 10,541,890 B1* | 1/2020 | Chen | G06F 16/2379 |
| 2005/0165520 A1* | 7/2005 | Ariyur | G05B 23/0232 |
| | | | 701/3 |
| 2008/0168308 A1* | 7/2008 | Eberbach | G06F 11/008 |
| | | | 714/39 |
| 2009/0024274 A1* | 1/2009 | Nagai | G01D 9/005 |
| | | | 701/33.4 |
| 2010/0174449 A1 | 7/2010 | Kim | |
| 2010/0268415 A1* | 10/2010 | Ishikawa | G07C 5/085 |
| | | | 701/33.4 |
| 2012/0176234 A1* | 7/2012 | Taneyhill | B60W 30/18145 |
| | | | 701/96 |
| 2014/0201355 A1* | 7/2014 | Bishnoi | H04L 41/0622 |
| | | | 709/224 |
| 2014/0358840 A1 | 12/2014 | Tactic et al. | |
| 2015/0185018 A1* | 7/2015 | Hesch | G06T 7/246 |
| | | | 701/501 |
| 2017/0041359 A1* | 2/2017 | Kwan | G06F 3/04842 |
| 2017/0274897 A1 | 9/2017 | Rink et al. | |
| 2018/0047285 A1* | 2/2018 | Johnson | G08G 1/164 |
| 2018/0208028 A1* | 7/2018 | Seubert | G01S 7/497 |

FOREIGN PATENT DOCUMENTS

| | | |
|---|---|---|
| CN | 104093618 A | 10/2014 |
| CN | 104882001 A | 9/2015 |
| DE | 102008010628 A1 | 8/2009 |
| DE | 102008047727 A1 | 3/2010 |
| DE | 102013206948 A1 | 11/2014 |
| DE | 102014205924 A1 | 10/2015 |
| DE | 102014208638 A1 | 11/2015 |
| DE | 102015208358 A1 | 11/2015 |
| DE | 102014015669 A1 | 4/2016 |
| EP | 0 847 029 A2 | 6/1998 |
| EP | 1881459 A2 | 1/2008 |
| EP | 2096447 A2 | 9/2009 |

OTHER PUBLICATIONS

International Preliminary Report on Patentability directed to related International Patent Application No. PCT/EP2018/063973, dated October 7, 2019, with attached English-language translation; 11 pages.

* cited by examiner

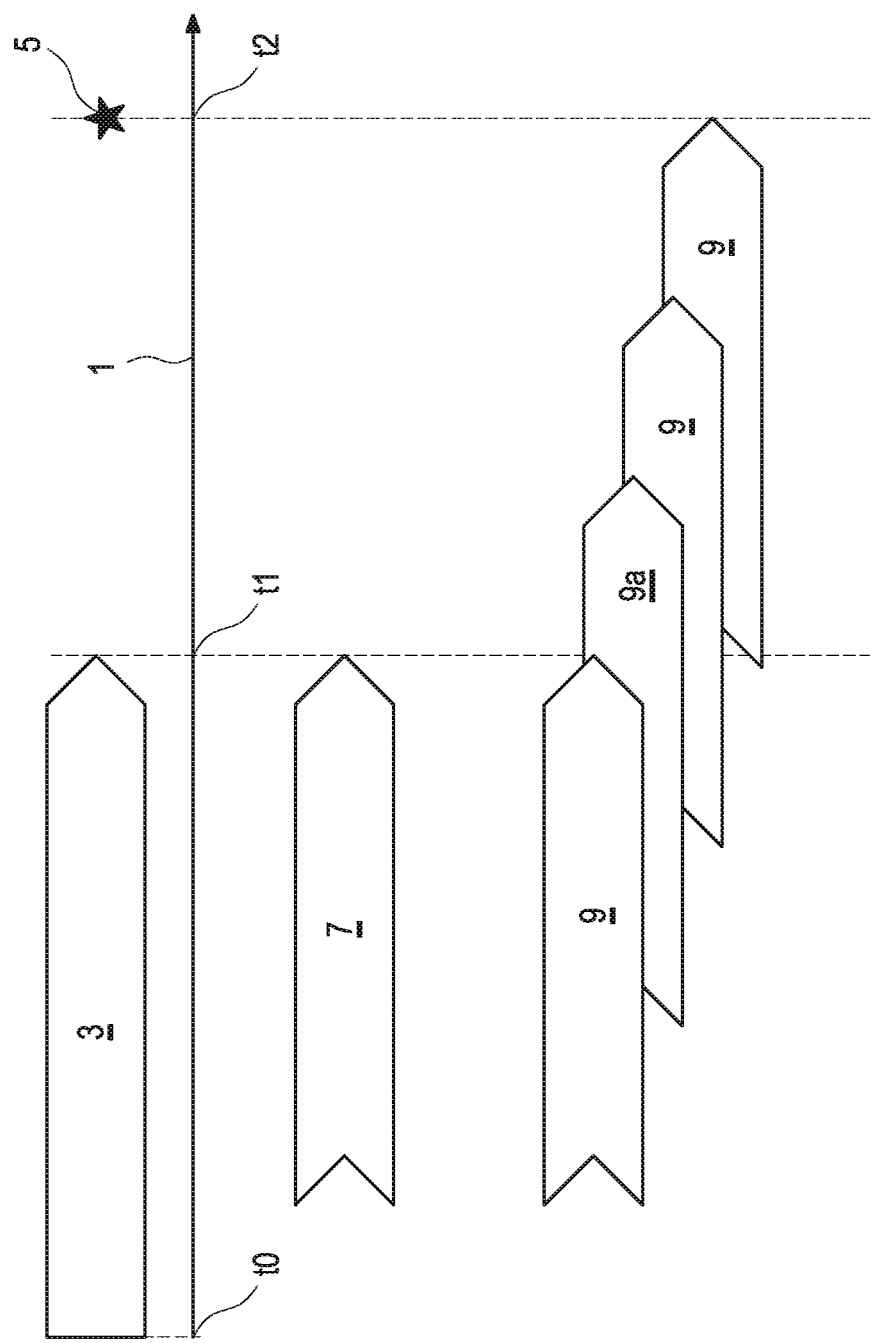

METHOD AND DEVICE FOR SITUATION-DEPENDENT STORAGE OF DATA OF A SYSTEM

TECHNICAL FIELD

The present disclosure relates to a method for situation-dependent storage of data of a system and a recording system for storing data of a system in the event of the occurrence of a predetermined trigger event.

BACKGROUND

Systems, such as vehicles, may be equipped with data recorders for recording in an accident. The main task of such data recorders is to make the intended behavior of vehicle systems in accident situations comprehensible. For this purpose, relevant data from a period of a few seconds before the accident are recorded in accident situations and near-accident situations, such as when an airbag is triggered or when emergency braking is triggered. These data are designed to objectivize accidents for individual parties in an accident and to assist in comprehending the course of the accident and understanding its circumstances.

In currently available data recorders, data are usually only stored in a period prior to the trigger event upon a trigger, i.e., when a trigger event occurs. Thus, for example, a data recording can end when triggering a restraint system. Such a fixed end of data storage can result in the loss of important information after the trigger event.

DE 10 2015 208 358 A1 discloses a method and a system for recording and/or securing video data in a vehicle. It disclosed that the video data is detected in an event-controlled manner and stored in a ring memory.

DE 10 2013 206 948 A1 discloses an apparatus and a method for providing data of an autonomous system and a method for producing an autonomous system. It disclosed that data are stored in a local memory during operation of the apparatus by means of an autopilot, said data being detected by a sensor in a certain interval.

A storage unit for vehicle data recording is disclosed in DE 10 2014 205 924 A1.

BRIEF DESCRIPTION OF DRAWINGS/FIGURES

FIG. 1 illustrates a schematic representation of a sequence of a method, in accordance with some embodiments.

DETAILED DESCRIPTION

An object of the present disclosure is to provide a way to store data of a system both before and after an accident. Embodiments of the present disclosure will become apparent from the description and the dependent claims.

In some embodiments, a method for situation-dependent storage of data of a system is presented. It is provided that data of the system is captured, amalgamated in at least one data block, and stored in a volatile memory. It is further provided that, in response to an entry of at least one predetermined trigger event, data amalgamated in the at least one data block is transferred from the volatile memory to a read-only memory. In this case, it is further provided that a time window in which the data for the at least one data block is detected is automatically and dynamically selected as a function of the at least one trigger event.

The method disclosed herein provides for storing data of a system, such as a vehicle, upon the occurrence of a trigger event, such as a switch from automatic driving to manual driving, in an accident or emergency braking. In some embodiments, the method is based on parameters such as a "recording window" or a time window in which data is detected that is to be transferred into a volatile memory and finally from the volatile memory into a read-only memory, variably at a time for triggering the data acquisition, i.e., for a trigger event. In this case, those portions of the time window that lie before or after the trigger event can each be permanently defined or influenced by other parameters.

In some embodiments, current data of the system, i.e., data captured by sensors of the system and/or processed by controllers of the system is first stored in a volatile memory, such as a ring buffer, and, in the event of a trigger event, are transferred from volatile memory into one read-only memory, i.e., a non-volatile memory such as EEPROM or a flash memory. Accordingly, the time window is defined in a parameterizable manner, from which window the data is transferred from the volatile memory to the non-volatile memory recorded therein in the event of the occurrence of the triggering, in a variable manner at the time of the record triggering or trigger of the data and their transmission to the non-volatile memory.

In some embodiments, to obtain an impression of a state of the system after a trigger event, such as after an ignition of an airbag has taken place, it is provided that in a time window determined by the trigger event, i.e., depending on a type of trigger event, captured data of the system, for example, of a vehicle, are first transferred to a volatile memory and then into a read-only memory. Accordingly, it is provided that the data to be transferred into the volatile memory is transmitted, amalgamated in at least one data block, to the volatile data memory. And, the data stored in the volatile memory is continuously updated.

In some embodiments, it is provided that the time window or time range is selected according to a respective trigger event, i.e., to a trigger, wherein data, in particular operating data of a system, are to be captured and/or transferred to the read-only memory in said time window or time range. This means that the time window is adapted or parameterized dynamically depending on a respective trigger event. For this purpose, a list may be provided that assigns a time window, i.e., a first time at which data acquisition starts and a second time at which the data collection ends, to the respective trigger events, which are predetermined, for example, by a number of sensor values and/or settings of apparatuses of a respective system.

In some embodiments, by successive transmissions of respective data into the volatile memory, which may, for example, be a ring buffer, the data in the volatile memory is updated continuously by respective transmissions. Accordingly, provision is made in particular for the data to be updated, for example, in a first area of the volatile memory, which is assigned to a predetermined time range of, for example, 30 seconds before a current time, such that the volatile memory always displays the data being recorded in the first area of the volatile memory in the specified time range before the current time. Furthermore, the volatile memory may have a second area or additional areas or storage capacities to which the data to be captured after the occurrence of a trigger event is to be written.

In some embodiments, data is transferred from a volatile memory to a read-only memory in response to a trigger event. Accordingly, it can be provided, in particular, that data captured even after the trigger event are transmitted to the volatile memory and subsequently to the read-only memory. This means that after an occurrence of the trigger event, the volatile memory continues to be filled with data for a period of time, which may for example be predetermined or determined by an available memory space, and that the data is then transferred from the volatile memory into the read-only memory such that data detected after the occurrence of the trigger event is also stored in the read-only memory.

In some embodiments, it is provided that the data stored in the volatile memory by means of a so-called "sliding window protocol" are transferred to the read-only memory depending on the at least one trigger event with a different time horizon before and after the at least one trigger event. Accordingly, the time window is chosen to be so large that at most the first area of the volatile memory is filled when respective data captured in the time window is transferred to the volatile memory. If a trigger event, such as activation of a restraining mechanism, is detected within the time window or at a current time, the time window is increased, such that a second area of the volatile memory is also filled with data. Accordingly, the second area of the volatile memory is filled with data that was or will be recorded in time after the trigger event. This means that the time window, which specifies a time range in which data is recorded, written to the volatile memory and subsequently written to the read-only memory, changes dynamically depending on the occurrence of a trigger event, i.e., the time window is extended in comparison with a standard operation.

In some embodiments, if no trigger event is detected, the data written to the volatile memory is not transferred to the read-only memory. Accordingly, the data written to the volatile memory is overwritten by new or current data.

In some embodiments, the time window can be defined in a parameterizable and variable manner by a respective triggering time, i.e., a trigger. Accordingly, respective portions of a recording period before or after the triggering time can be permanently defined or influenced by currently detected parameters.

In some embodiments, it is provided that in the event that a trigger event is detected, each captured data will not be overwritten in the read-only memory after they have been written to the read-only memory.

By way of non-limiting example, a sequence of the method according to some embodiments as described herein can be configured as follows:

1) acquiring data of the system by reading sensors and/or controllers at a time t0;

2) transferring the data read out to a volatile memory at a time t1;

3) acquiring data of the system by reading sensors and/or controllers at a time t2;

3a) transmitting the read-out data and overwriting the data in the volatile memory at a time t4, if no trigger event was detected;

3b) If a trigger event was detected at a time t3, t2<t3≤t4: Transmitting data captured in a predetermined time range [t3−x, t3] to the read-only memory before the trigger event;

3c) detecting data captured by the sensors after the trigger event or processed by the control units, 3d) transmitting the read-out data into the volatile memory at a time t5, and 3e) transmitting the data captured in a predetermined time range [t3, t3+y] after the trigger event into the read-only memory in addition to the data transmitted in step 3b).

x and y are respective periods of time, where x, y can each be in the seconds, minutes or hours range. The times t0, t1, t2, t3, t4 and t5 are concrete times, which can be defined in each case with a date and a concrete time.

In some embodiments, it is provided that the predetermined trigger event is predetermined by a list of predetermined trigger events. It is provided that at least one value of a sensor of the system and/or a state of a component of the system is assigned by the list to each trigger event of the list.

In some embodiments, by way of non-limiting example, a system may be a vehicle, a wind energy plant, an escalator, an elevator, an autonomously flying drone, an alarm system or any other technical system.

In some embodiments, a plurality of trigger events may be provided. Each trigger event is leading to a collection of data beyond a time of occurrence of the respective trigger event, i.e., to a collection of data that are after the time of the occurrence of the trigger event. Accordingly, a trigger event, for example, can be reported by a central control unit or recognized by a safety control unit by comparing values detected by respective sensors of a respective system with values specified in the above list.

In some embodiments, in trigger events, a change of an operating mode of a respective system, for example, such as a vehicle, can be provided from a fully automatic operation to a manual operation or an activation or deactivation of an assistance system. By way of non-limiting example, to detect a plurality of trigger events of different systems or trigger events of the same system that occur several times in succession, each of which leads to a transmission into the read-only memory.

In some embodiments, it is provided that the time window in which the data is captured and transmitted into the volatile memory extends from a first time before the trigger event to a second time after the trigger event.

In some embodiments, the first time and/or the second time are provided in a fixed predetermined time interval for a respective trigger event or for each other. By a fixed time interval to a respective trigger event, a storage space requirement can be specified, such that always enough space in a respective volatile memory is ready for saving data collected from the trigger event until the second time, by a fixed time interval of the first time from the trigger event.

In some embodiments, by way of non-limiting example, it is provided that a time is selected as the first time between 40 seconds and 20 seconds, preferably between 35 seconds and 25 seconds, more preferably exactly 30 seconds before the trigger event and as the second time a time between 40 seconds and 20 seconds, preferably between 35 seconds and 25 seconds, more preferably exactly 30 seconds after the trigger event.

In some embodiments, a distance of 30 seconds to a respective trigger event is used, for example, to reconstruct an accident.

In some embodiments, it is provided that the first time and/or the second time are selected as a function of the trigger event.

Since different trigger events require different event horizons, a data collection to a type of each trigger event may be adapted. For example, provision may be made for data to be recorded and stored in the event of an accident as a trigger event over a particularly large time window of, for example, several minutes. By way of non-limiting example, it can be provided that, in the case of an error message, trigger events are recorded and stored only for a few seconds. In both cases, the respective time window may extend beyond the time of the trigger event, i.e., the first time, as the start of the time window, may be before and the second time, as the end of the time window, may be after the time of the occurrence of the trigger event.

In some embodiments, it is provided that a time is selected as the second time, to which the volatile memory is completely filled.

In some embodiments, to determine as much data as possible on a trigger event, such as an accident, it may be provided that a respective volatile memory is used completely. Accordingly, it may be provided that a predefined first area of the volatile memory is written with data that were captured prior to a respective trigger event and a corresponding remaining area or area of the volatile memory that is not associated with the first area is written with data that is captured after the trigger event. Accordingly, the volatile memory can, for example, be written with data until the volatile memory is full.

In some embodiments, it is provided that a server to be contacted via a communication interface of the system is selected as the read-only memory.

In some embodiments, the solid-state memory can be, in particular, a server configured as a so-called "cloud memory" or any other server or memory to be contacted via a communication interface of the system provided according to the invention.

By way of non-limiting example, the solid-state memory may also be a solid-state memory, such as an EEPROM, which is encompassed by the system as described herein in accordance with some embodiments.

The present disclosure further relates to a recording system for storing data of a system in the event of occurrence of a predetermined trigger event, the recording system comprising at least one volatile memory, at least one read-only memory and a controller, the controller being configured to receive data from the system, to combine said data in at least one data block, and to store the at least one data block in the at least one volatile memory, and to transfer data stored in the volatile memory to the read-only memory, in response to an occurrence of the predetermined trigger event, wherein a time window, in which the data is to be captured for the at least one data block, is predetermined dynamically and automatically depending on the at least one trigger event.

The recording system as described herein is used particularly for carrying out the method in accordance with some embodiments as described herein.

Further advantages and embodiments can be found in the description and the attached drawing.

It is evident that the features mentioned above and those yet to be described below can be used not only in the particular combination indicated, but also in other combinations or in isolation, without exceeding the scope of the present disclosure.

The present disclosure is depicted schematically by means of embodiments in the drawing and shall be described schematically and in detail with reference to the drawing.

FIG. 1 illustrates a schematic representation of a sequence of a method, in accordance with some embodiments. FIG. 1 shows a flow chart, which is oriented along a time axis 1. At a time t0, for example, an automated driving function of a system, such as a vehicle, is active, as indicated by bar 3. At a time t1, a trigger event occurs by prompting a driver to control the vehicle by taking manual control. At a time t2, another trigger event, such as activation of a restraint system of the vehicle, occurs, as indicated by reference number 5.

In accordance with some embodiments, data recording of data from the vehicle ends with deactivation of the automatic driving function at time t1, as indicated by bar 7, which represents a record of data during automatic driving according to traditional methods, such that events occurring after time t1 cannot be reconstructed.

In accordance with some embodiments, to reconstruct a course of events which have led to the activation of the restraint system of the vehicle at the time t2, it is provided according to the present method that data is captured not only before the time t1 but also beyond the time t1. For this purpose, it is provided that a recording readiness of a recording system for acquiring the data from the time t1, when the driver is indicated that he should control the vehicle manually, remains active for a predetermined or variable period of time. Accordingly, the recording system "watches" beyond time t1, i.e., writes data on a volatile memory. For this purpose, currently captured data are amalgamated in a data block 9 and transferred to the volatile memory. The data stored in the volatile memory is continuously replaced, updated and/or expanded by new data blocks 9.

When a trigger event is detected at time t1, such as the changes in the operating state of the vehicle from the autonomous operation to the manual operation, a time window is selected in which data is transmitted to the volatile memory and finally to the read-only memory, depending on the trigger event. In the case of the trigger event at time t1, the data in a time range 9a, which extends from a first time before the time t1 to a second time after the time t1, can be transferred to the read-only memory and evaluated accordingly later. For this purpose, it is provided that the data lying after the time t1 is detected after the time t1, written into the volatile memory and then written to the read-only memory, for example, after expiration of the time range 9a.

In accordance with some embodiments, in the case of a trigger event, the data stored in the volatile memory can be retroactively transferred to the read-only memory in the period between t1 and t2, even if the fully automatic operating mode has already ended.

In accordance with some embodiments, the recording period can be made variable in time, as indicated by bar 9, in a so-called "sliding window approach." In response to a detection of a trigger event, the stored data on the volatile memory are transferred to a read-only memory and saved for evaluation. It is provided that a size or a border region of a respective window of the "sliding window approaches" can be permanently determined and/or can possibly be changed depending on a respective detected trigger event.

In accordance with some embodiments, data is transferred to the read-only memory before a respective trigger event, such as the activation of the restraint system at time t2. For this purpose, the trigger event "activation of the restraint system" can be assigned a time window which is characterized by times which lie before or at the time t2.

The invention claimed is:

1. A method for situation-dependent storage of data of a system, the method comprising:
   receiving data of the system amalgamated in at least one data block, wherein the data is stored in a volatile memory;
   detecting at least one predetermined trigger event associated with a change of operating mode of a vehicle;
   in response to the detection of the at least one predetermined trigger event, transferring the data of the system amalgamated in the at least one data block from the volatile memory to a read-only memory;

based on a nature of the at least one predetermined trigger event, automatically and dynamically selecting a duration of a time window for which the data for the at least one data block is transferred, wherein the time window extends from a first time before the at least one predetermined trigger event to a second time after the at least one predetermined trigger event;

based on the nature of the at least one predetermined trigger event, dynamically selecting the first time and the second time; and based on a time of occurrence of the at least one predetermined trigger event, dynamically extending the duration of the time window for which data related to the predetermined trigger event is recorded, written to the volatile memory and subsequently written to the read-only memory using a sliding window protocol.

2. The method of claim 1, wherein the nature of the at least one predetermined trigger event comprises a deactivation of an autonomous operation of the system, an activation of an assistance system, a deactivation of the assistance system, or a change of a fully automatic operation of the vehicle into a manual operation.

3. The method of claim 1, wherein the detecting the at least one predetermined trigger event comprises detecting deactivating of an autonomous operation of the system.

4. The method of claim 1, further comprising selecting data acquired from at least one sensor of the system or data processed by at least one controller of the system as the data of the system.

5. The method of claim 1, wherein the detecting the at least one predetermined trigger event comprises:

assigning at least one value of a sensor of the system or a state of a component of the system to each predetermined trigger event from a list of predetermined trigger events; and detecting the at least one predetermined trigger event from the list of predetermined trigger events.

6. The method of claim 1, wherein the transferring the data of the system comprises transferring the data stored in the volatile memory using a sliding window protocol to the read-only memory with a different time horizon before and after the at least one predetermined trigger event.

7. The method of claim 1, wherein the transferring the data of the system comprises transferring the data of the system to a server as the read-only memory, wherein the server is contacted via a communication interface of the system.

8. A recording system for storing data of a system, the recording system comprising:

at least one volatile memory;

at least one read-only memory; and a controller configured to:

continuously receive data from the system, combine the data in at least one data block, store the at least one data block in the at least one volatile memory, in response to an occurrence of a predetermined trigger event associated with a change of operating mode of a vehicle, transfer data stored in the at least one volatile memory to the at least one read-only memory, based on a nature of the predetermined trigger event, automatically and dynamically select a duration of a time window for which the data is transferred from the at least one volatile memory to the at least one read-only memory, wherein the time window extends from a first time before the at least one predetermined trigger event to a second time after the trigger event, based on the nature of the predetermined trigger event, dynamically select the first time and the second time, and based on a time of occurrence of the at least one predetermined trigger event, dynamically extending the duration of the time window for which data related to the predetermined trigger event is recorded, written to the volatile memory and subsequently written to the read-only memory using a sliding window protocol.

9. The recording system of claim 8, wherein the nature of the predetermined trigger event comprises a deactivation of an autonomous operation of the system, an activation of an assistance system, a deactivation of the assistance system or a change of a fully automatic operation of the vehicle into a manual operation.

* * * * *